United States Patent
Fair et al.

(10) Patent No.: US 7,157,798 B1
(45) Date of Patent: Jan. 2, 2007

(54) SELECTIVE REFRACTORY METAL AND NITRIDE CAPPING

(75) Inventors: James A. Fair, Mountain View, CA (US); Robert H. Havemann, Pleasanton, CA (US); Jungwan Sung, Santa Clara, CA (US); Nerissa Taylor, Milpitas, CA (US); Sang-Hyeob Lee, Santa Clara, CA (US); Mary Anne Plano, Mountain View, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 10/984,126

(22) Filed: Nov. 8, 2004

Related U.S. Application Data

(62) Division of application No. 10/435,010, filed on May 9, 2003, now Pat. No. 6,844,258.

(51) Int. Cl.
  *H01L 23/48* (2006.01)
(52) U.S. Cl. ............... 257/768; 257/758; 257/E23.163
(58) Field of Classification Search ................. 257/768
  See application file for complete search history.

(56) References Cited

U.S. PATENT DOCUMENTS

| | | | |
|---|---|---|---|
| 4,804,560 A | 2/1989 | Shioya et al. | |
| 5,028,565 A | 7/1991 | Chang et al. | |
| 5,227,329 A | 7/1993 | Kobayashi et al. | |
| 5,250,329 A | 10/1993 | Miracky et al. | |
| 5,326,723 A | 7/1994 | Petro et al. | |
| 5,391,394 A | 2/1995 | Hansen | |
| 5,661,080 A | 8/1997 | Hwang et al. | |
| 5,726,096 A | 3/1998 | Jung | |
| 5,795,824 A | 8/1998 | Hancock | |
| 5,804,249 A | 9/1998 | Sukharev et al. | |
| 5,817,576 A | 10/1998 | Tseng et al. | |
| 5,956,609 A | 9/1999 | Lee et al. ................... 438/627 |
| 6,001,729 A | 12/1999 | Shinriki et al. | |
| 6,017,818 A | 1/2000 | Lu | |
| 6,066,366 A | 5/2000 | Berenbaum et al. | |
| 6,099,904 A | 8/2000 | Mak et al. | |
| 6,107,200 A | 8/2000 | Takagi et al. | |
| 6,143,082 A | 11/2000 | McInerney et al. | |
| 6,174,812 B1 | 1/2001 | Hsiung et al. | |
| 6,245,654 B1 | 6/2001 | Shih et al. | |
| 6,265,312 B1 | 7/2001 | Sidhwa et al. | |
| 6,294,468 B1 | 9/2001 | Gould-Choquette et al. | |

(Continued)

FOREIGN PATENT DOCUMENTS

WO    WO01/27147    4/2001

OTHER PUBLICATIONS

Chan et al., "Methods for Growing Low-Resistivity Tungsten Film", Novellus Systems, Inc., filed Nov. 1, 2005, U.S. Appl. No. 11/265,531, pp. 1-35. [NOVLP137/NVLS-0003093].

(Continued)

*Primary Examiner*—Tu-Tu Ho
(74) *Attorney, Agent, or Firm*—Beyer Weaver & Thomas LLP

(57) ABSTRACT

A method for creating a refractory metal and refractory metal nitride cap effective for reducing copper electromigration and copper diffusion is described. The method includes depositing a refractory metal nucleation layer and nitriding at least the upper portion of the refractory metal layer to form a refractory metal nitride. Methods to reduce and clean the copper lines before refractory metal deposition are also described. Methods to form a thicker refractory metal layer using bulk deposition are also described.

13 Claims, 4 Drawing Sheets

U.S. PATENT DOCUMENTS

| | | | |
|---|---|---|---|
| 6,297,152 | B1 | 10/2001 | Itoh et al. |
| 6,309,966 | B1 | 10/2001 | Govindarajan et al. |
| 6,355,558 | B1 | 3/2002 | Dixit et al. |
| 6,551,929 | B1 | 4/2003 | Kori et al. |
| 6,566,250 | B1 | 5/2003 | Tu et al. |
| 6,566,262 | B1 | 5/2003 | Rissman et al. |
| 6,607,976 | B1 | 8/2003 | Chen et al. |
| 6,635,965 | B1 | 10/2003 | Lee et al. |
| 6,706,625 | B1 | 3/2004 | Sudijono et al. |
| 6,740,585 | B1 | 5/2004 | Yoon et al. |
| 6,844,258 | B1 | 1/2005 | Fair et al. |
| 6,861,356 | B1 | 3/2005 | Matsuse et al. |
| 6,962,873 | B1 * | 11/2005 | Park ............... 438/627 |
| 2001/0008808 | A1 * | 7/2001 | Gonzalez ............ 438/770 |
| 2001/0014533 | A1 * | 8/2001 | Sun ................ 438/655 |
| 2001/0015494 | A1 * | 8/2001 | Ahn ................ 257/734 |
| 2001/0044041 | A1 * | 11/2001 | Badding et al. ........ 429/32 |
| 2002/0090796 | A1 | 7/2002 | Desai et al. |
| 2002/0177316 | A1 * | 11/2002 | Miller et al. ......... 438/689 |
| 2003/0059980 | A1 | 3/2003 | Chen et al. |
| 2003/0104126 | A1 | 6/2003 | Fang et al. ......... 427/255.392 |
| 2003/0127043 | A1 | 7/2003 | Lu et al. |
| 2004/0044127 | A1 | 3/2004 | Okubo et al. |
| 2004/0206267 | A1 | 10/2004 | Sambasivan et al. |

OTHER PUBLICATIONS

Levy et al., "Deposition of Tungsten Nitride", Novellus Systems, Inc., filed Dec. 16, 2005, U.S. Appl. No. 11/305,368, pp. 1-39. [NOVLP063D1/NVLS-2615D1].

U.S. Office Action mailed Dec. 28, 2005, from U.S. Appl. No. 10/815,560 [NOVLP096/NVLS-2902].

U.S. Office Action mailed Dec. 28, 2005, from U.S. Appl. No. 10/649,351 [NOVLP033X1/NVLS-000498X1].

Wongsenakhum et al., "Reducing Silicon Attack and Improving Resistivity of Tungsten Nitride Film", Novellus Systems, Inc., filed Feb. 6, 2006, U.S. Appl. No. Not yet assigned, pp. 1-26. [NOVLP138/NVLS-3094].

Presentation by Inventor James Fair: "Chemical Vapor Deposition of Refractory Metal Silicides," 27 Pages, 1983.

Saito et al., "A Novel Copper Interconnection Technology Using Self Aligned Metal Capping Method," IEEE, 3 Pages, 2001.

Lee et al., PCT Search Report, Completed Oct. 15, 2004, PCT/US2004/006940, Int'l filing date May 3, 2004.

Lee et al., Written Opinion, Completed Oct. 15, 2004, PCT/US2004/006940, Int'l filing date May 3, 2004.

George et al., "Surface Chemistry for atomic Layer Growth", J. Phys. Chem, 1996, vol. 100, No. 31, pp. 13121-13131.

Bell et al., "Batch Reactor Kinetic Studies of Tungsten LPCVD from Silane and Tungsten Hexafluoride", J. Electrochem. Soc., Jan. 1996, vol. 143, No. 1, pp. 296-302.

Klaus et al., "Atomic layer deposition of tungsten using sequential surface chemistry with a sacrificial stripping reaction", Thin Solid Films 360 (2000) 145-153.

Klaus et al., "Atomically Controlled Growth of Tungsten and Tungsten Nitride Using Sequential Surface Reactions," Applied Surface Science, 162-163, (2000) 479-491.

Li et al., "Deposition of $WN_xC_y$ Thin Films by ALCVD™ Method for Diffusion Barriers in Metallization," IITC Conference Report, 2002, 3 Pages.

Elam et al, "Nucleation and Growth During Tungsten Atomic Layer Deposition on $SiO_2$ Surfaces," Thin Solid Films, 2001, 13 Pages.

Collins et al., "Pulsed Deposition of Ultra Thin Tungsten from Plugfill of High Aspect Ratio Contacts," Presentation made at Semicon Korea 2003, Jan. 21, 2003, 9 pages.

Collins, et al., "Pulsed Deposition of Ultra Thin Tungsten for Plugfill of High Aspect Ratio Contacts," Semiconductor Equipment and Materials International, Semicon Korea, Jan. 21, 2003, 3 pages.

Lee et al., Pulsed Deposition of Ultra Thin Tungsten and its Application for Plugfill of High Aspect Ratio Contacts, Abstract, Jan. 21, 2003, 1 page.

U.S. Office Action mailed Jul. 12, 2005, from U.S. Appl. No. 10/815,560.

Wongsenakhum et al., "Method of Forming Low-Resistivity Tungsten Interconnects", Novellus Systems, Inc., filed Mar. 31, 2004, U.S. Appl. No. 10/815,560, pp. 1-30.

U.S. Office Action mailed Jul. 17, 2002, from U.S. Appl. No. 09/975,074.

U.S. Office Action mailed Feb. 8, 2005, from U.S. Appl. No. 10/649,351.

U.S. Office Action mailed Jul. 14, 2005, from U.S. Appl. No. 10/649,351.

U.S. Office Action mailed Jun. 22, 2004, from U.S. Appl. No. 10/435,010.

U.S. Office Action mailed Mar. 23, 2005, from U.S. Appl. No. 10/690,492.

Levy e al., "Deposition of Tungsten Nitride", Novellus Systems, Inc., filed Oct. 20, 2003, U.S. Appl. No. 10/690,492, pp. 1-42.

Lee et al., "Method for Reducing Tungsten Film Roughness and Improving Step Coverage", Novellus Systems, Inc., filed Aug. 26, 2003, U.S. Appl. No. 10/649,351, pp. 1-40.

Chan et al., "Methods for Growing Low-Resistivity Tungsten Film", Novellus Systems, Inc., filed Nov. 1, 2005, U.S. Appl. No. 11/265,531, pp. 1-35, [NOVLP137/NVLS-0003093]. [NOVLP063D1/NVLS-2615D1].

U.S. Office Action mailed Dec. 28, 2005, from U.S. Appl. No. 10/815,560 [NOVLP096/NVLS-2902].

U.S. Office Action mailed Dec. 28, 2005, from U.S. Appl. No. 10/649,351 [NOVLP033X1/NVLS-000498X1].

Wongsenakhum et al., "Reducing Silicon Attack and Improving Resistivity of Tungsten Nitride Film", Novellus Systems, Inc., filed Feb. 6, 2006, U.S. Appl. No. Not yet assigned, pp. 1-26. [NOVLP138/NVLS-3094].

* cited by examiner

SELECTIVE REFRACTORY METAL AND NITRIDE CAPPING

CROSS-REFERENCE TO RELATED APPLICATIONS

This application is a divisional of U.S. patent application Ser. No. 10/435,010 (Now U.S. Pat. No. 6,844,258) filed May 9, 2003. This application is incorporated herein by reference for all purposes.

FIELD OF THE INVENTION

This invention pertains to methods for depositing refractory metal and creating a refractory metal nitride over the deposited refractory metal. More specifically, the invention pertains to methods that deposit a layer of refractory metal and refractory metal nitride over copper lines on a semiconductor device so as to prevent electromigration of the copper line and diffusion of copper into substrate material.

BACKGROUND OF THE INVENTION

Because copper has a lower resistivity and higher resistance to electromigration compared to aluminum, it has become the preferred material for creating conductive lines in high performance integrated circuits. Since Cu does not readily form volatile compounds and is therefore difficult to dry etch, the fabrication of Cu interconnects requires a damascene approach, whereby a metal is deposited into a recess etched in an insulating material (dielectric) and then planarized using chemical mechanical polish (CMP). While the damascene concept is straightforward and has been used for centuries in jewelry making, etc., the fabrication of damascene Cu interconnects in integrated circuits is a challenging task due to problems associated with Cu integrations.

One integration issue is that Cu can readily diffuse into surrounding oxide-like or polymeric dielectric materials when subjected to high temperatures of subsequent fabrication processes. Diffusion of Cu into the surrounding insulating dielectric will lead to line-to-line leakages and eventual device failure. So it is necessary to fully enclose Cu lines with diffusion barriers. FIG. 1 illustrates a cross section of a part of a damascene device in which a Cu line 101 is encapsulated by metal diffusion barriers 105, typically made of tantalum, tantulum nitride or combination thereof, between the Cu and surrounding dielectric material 107. In addition, a dielectric capping layer 103 is deposited between the Cu line 101 and dielectric 109 to avoid electrical shorting of adjacent metal lines and to complete the Cu encapsulation. The dielectric capping layer material is typically silicon nitride because of its ability to block Cu diffusion and resist the dielectric etches used to define subsequent vias to the overlying metal level. Prior to deposition of the dielectric capping layer, the copper oxide that has formed on the surface of the Cu (Cu readily oxidizes when exposed to water or air) must be removed by chemical reduction to promote adhesion and optimize device reliability.

Another integration issue when using Cu as the primary conductor in devices is that Cu can easily electromigrate into the surrounding dielectric material. In general, electromigration occurs when the metal atoms of conductive lines are subjected to electric fields while the circuit is in operation. The metal atoms will redistribute in the direction of the electron flow to form voids (areas lacking metal material) and extrusions (protrusions of metal material outside of the metal or dielectric barrier) along the length of the metal lines. For example, this is illustrated in damascene device of FIG. 1. A void 111 has formed at the silicon nitride/Cu interface, causing the Cu buildup and formation of an extrusion 113 downstream of the electron flow 115 in the Cu line 101. Voids will cause the Cu line to thin and eventually separate completely, causing an open circuit. Extrusions can cause the Cu metal to extend past the Cu line into an adjacent Cu line, thereby causing a short circuit.

Although silicon nitride as a capping layer material is effective in blocking Cu diffusion, there are some problems of using a silicon nitride capping layer, especially related to the electromigration issues described above. For example, it has been observed that voids caused by electromigration (described above) are observed most frequently at the edges of the Cu lines at the silicon nitride/Cu interface. This is likely partly due to the poor adhesion between silicon nitride and Cu. Furthermore, once a void is formed, the area around the void will experience increased electron flux, causing even more pronounced electromigration and acceleration of the degradation process. Another issue with using silicon nitride as a capping layer is that silicon nitride has a relatively high dielectric constant. This means that when a layer of silicon nitride is directly on top of and adjacent to the Cu conductive lines, there is an increase in overall capacitance between the conductive lines, which increases the RC time delay.

Because of the problems associated with using silicon nitride, others have proposed using other materials for capping Cu lines. For example, Saito, et al (0-7803-6679-4/01, 2001 IEEE) has studied the preferential deposition of tungsten to cap Cu lines. One reason for this is because tungsten adheres well to Cu. In addition, tungsten has a relatively low resistivity compared to silicon nitride.

There are other integration issues, however, associated with using tungsten and other refractory metals for capping of Cu lines. Since a refractory metal is more conductive than silicon nitride, it must be selectively deposited over copper lines with minimal coverage over the insulating regions of the device. It is also important that the refractory metal be deposited conformally and particle-free so that there is good contact between Cu and the capping layer. This uniform and selective deposition of a refractory metal can be difficult to achieve. In a single-step process certain areas of the substrate will start to nucleate before other areas. The film will then start to grow in these regions first, leading to a large uncontrolled non-uniformity. In some cases the regions that started growing first will get thick, thereby causing adjacent areas of the substrate to loose selectivity.

What is therefore needed is a process for forming a selective refractory metal capping layer that obviates these and other problems.

SUMMARY OF THE INVENTION

The present invention provides a method for depositing a refractory metal capping layer and creating a refractory metal nitride over this deposited refractory metal effective for preventing Cu electromigration and diffusion in Cu semiconductor devices. The invention involves at least two of the following operations: creating a nucleation layer of refractory metal over at least the exposed Cu lines, depositing the refractory metal in bulk over at least the nucleation layer surface (or exposed copper lines if no nucleation layer is used), and nitriding at least an upper portion of the bulk refractory metal layer.

In one embodiment, the methods of the invention first reduce copper oxide on the exposed copper lines prior to refractory metal deposition. The method may employ hydrogen gas at suitable chamber conditions to reduce the Cu oxide to Cu metal. Alternatively, the method may reduce the copper oxide using a mixture of hydrogen gas and one or both of argon or nitrogen gas. Alternatively, the method may employ a reducing agent such as $SiH_4$, $Si_2H_6$ or $B_2H_6$. The Cu surface may be cleaned prior to being reduced by using either hydrogen plasma or wet cleaning.

Using normal bulk deposition procedures, initiation of deposition can be difficult. As a consequence, non-uniform film growth will occur, with subsequent loss of selectivity in some regions of the wafer. One way of getting around this problem is to use a process step that is tuned to achieve nucleation, as opposed to bulk film growth. The process conditions are then changed for the bulk of the growth. Therefore the present invention preferably makes use of a refractory metal nucleation layer to facilitate the overall deposition process. The use of a nucleation layer also allows precise control of the amount of refractory metal deposited. In addition, the resultant nucleation layer is conformal, uniform and particle free.

Accordingly, one aspect of the invention provides a method for depositing a refractory metal nucleation layer onto the Cu surface of the substrate surface (which has been optionally reduced and/or cleaned). The method may involve depositing a tungsten nucleation layer by using, for example, one of $WF_6$, $WCl_6$ or $W(CO)_6$. Alternatively, the method may involve depositing a tantalum, titanium, molybdenum, ruthenium or cobalt nucleation layer using an appropriate precursor. The method may be performed such that the copper oxide reduction process and the deposition of the refractory metal nucleation layer process use the same chamber, but possibly at different chamber temperatures and pressures.

In one embodiment, the nucleation layer is formed by an atomic layer deposition (ALD) method by sequentially injecting a refractory metal precursor (e.g., $WF_6$) and a reducing agent (e.g., $SiH_4$ and/or $Si_2H_6$) gas into the reaction chamber. Alternatively, the method may produce the refractory metal nucleation layer by first converting the exposed Cu surfaces to copper silicide and then converting the copper silicide to the desired refractory metal nucleation layer. This method may be performed by exposing the Cu surface to $SiH_4$ to form copper silicide, then exposing the copper silicide to a refractory metal-containing gas to form the refractory metal nucleation layer. The method may be performed such that the formation of the copper silicide and conversion of copper silicide to the desired refractory metal use different chamber temperatures and pressures. Preferably though, the two operations use the same process chamber. In all embodiments, the refractory metal deposition is preferably performed in a manner that selectively covers the exposed copper lines, without depositing significantly on surrounding dielectric material.

The nitride layer is preferably formed on top of the refractory metal layer (bulk or nucleation) by a nitrogen containing gas such as $N_2$, $NH_3$ or $N_2H_4$. The nitrogen containing gas may be converted, at least partially, to a plasma, which is, in one embodiment, directed to the substrate by biasing the substrate with an RF powered electrode.

These and other features and advantages of the invention will be described in more detail below with reference to the associated drawings.

DETAILED DESCRIPTION OF THE PREFERRED EMBODIMENTS

Introduction

As indicated, the present invention provides a capping layer of a refractory metal. That metal may be formed by first depositing a nucleation layer followed by a bulk layer. In some embodiments, the nucleation layer is all that is required. This may be the case when only a very thin refractory metal layer is required. With or without a bulk layer deposited on the nucleation layer, the invention may also employ a nitride layer formed from some or all of the refractory metal.

Figure 1:
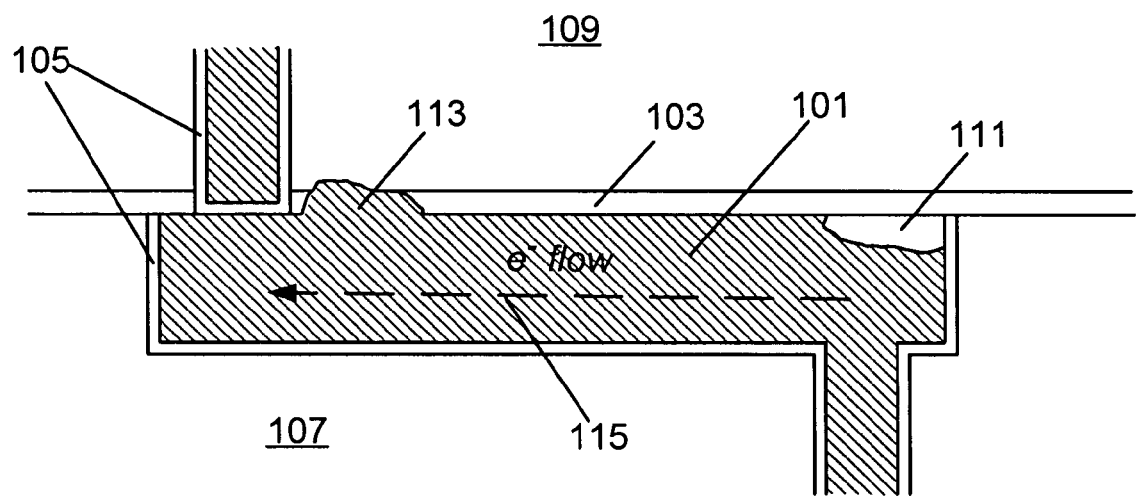
FIG. 1 is a schematic illustration of part of a damascene structure in a semiconductor device showing a void in a copper line caused by the electromigration.
Figure 2:
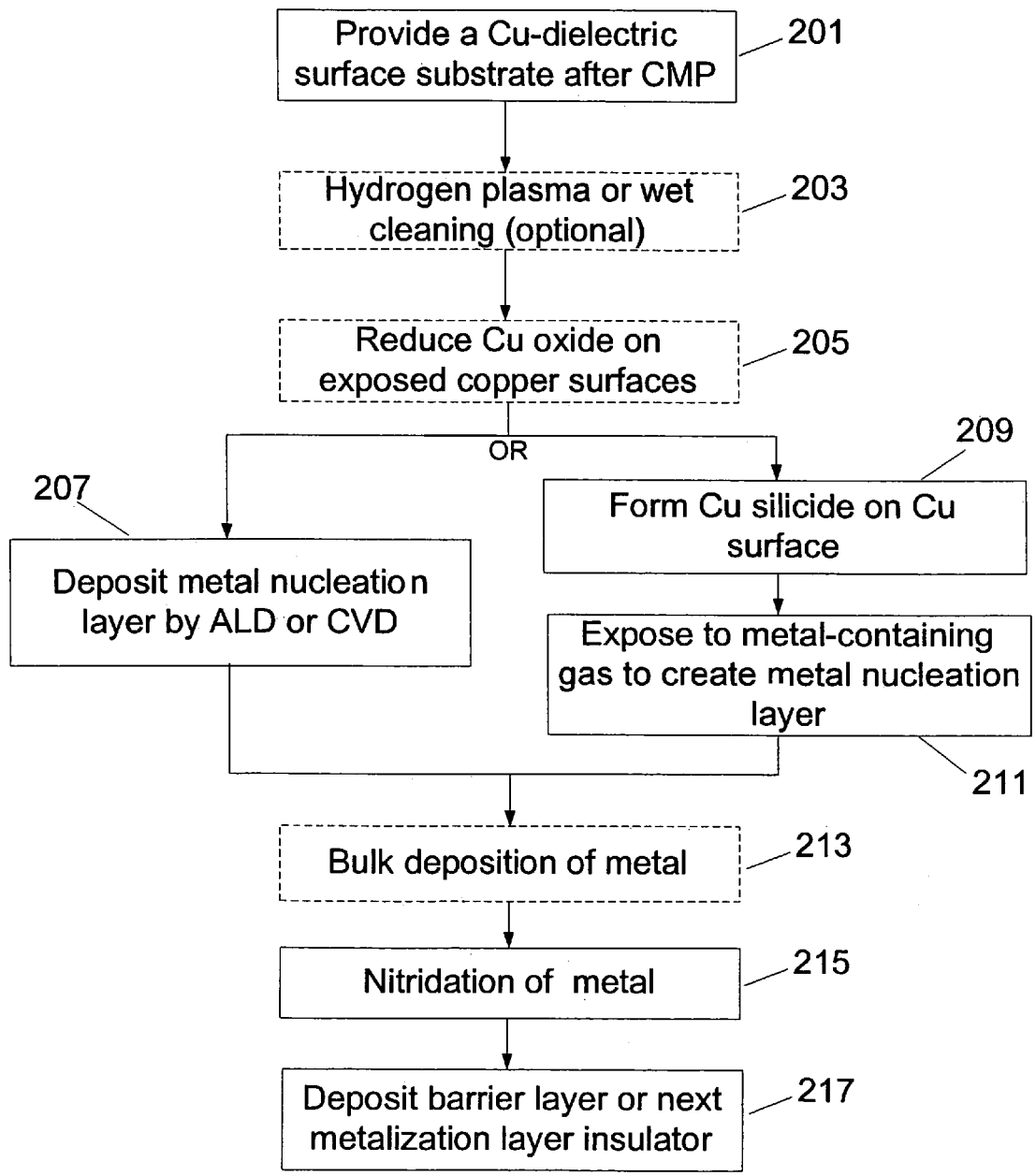
FIG. 2 is a process flow diagram illustrating relevant operations employed in the present invention. A refractory metal nucleation layer is formed onto a copper-dielectric substrate, followed by bulk deposition of the refractory metal, followed by nitridation of the bulk refractory metal surface.

A typical process flow for the formation of a capping layer employed in accordance with this invention is illustrated in the flowchart of FIG. 2. First a partially fabricated semiconductor device is provided 201. This device has exposed copper lines in a dielectric support. In the case of a damascene process, the copper lines are inlaid in the dielectric support after the support has had line paths and vias etched therein. Typically the partially fabricated device has a planarized surface comprised of the exposed copper lines and surrounding dielectric. Conventionally, planarization is achieved via chemical mechanical polishing (CMP). But other planarization techniques such as electropolishing or related electrolytic technique may be used. After the substrate goes through a CMP process, it may then be subjected to a wet clean and water rinse. See 203.

After the substrate is cleaned (if at all), it is often desirable to expose the surface of the Cu to a reducing agent. See 205. This is done because in the processes used to generate the device, the exposed copper lines will have some amount of copper oxide formed thereon. Reducing the exposed Cu will promote the formation of high quality adherent capping layers. This is an optional procedure for this invention. Examples of suitable reducing agents include $H_2$, $SiH_4$, $Si_2H_6$ and $B_2H_6$. As a further option, the wafer can then be cleaned using, for example, a hydrogen plasma.

After performing the cleaning and reduction operations (if they are performed at all), the process forms a nucleation layer of a refractory metal over at least the exposed copper lines. This may be accomplished by various techniques as will be described in detail later. See 207 and 209–211. Thereafter, a refractory metal bulk layer is optionally formed by a bulk deposition procedure 213. The nucleation layer is distinct from the bulk layer in that it is formed by a process that deposits the refractory metal relatively easily—in comparison to the bulk deposition process. In one example, the nucleation layer is deposited by a refractory metal precursor (e.g., $WF_6$) and a silicon containing reducing agent (e.g., silane). See 207. The bulk layer is deposited with a similar metal precursor, but the reducing agent is frequently hydrogen. In another approach, the nucleation layer is formed in two separate operations, 209 and 211. In operation 209, the process forms a copper silicide layer on the exposed copper lines. Subsequently, in operation 211, the process reacts that silicide with a refractory metal precursor such $WF_6$, which creates volatile $SiF_4$ as a byproduct. The resulting nucleation layer is rich in refractory metal, e.g., tungsten in this case.

After the refractory metal bulk layer is formed at 213, the process next involves converting some or all of the refractory metal layer(s) to refractory metal nitride. See 215. This is accomplished by exposing the refractory metal to a nitridation agent such as nitrogen, ammonia and/or hydrazine. If only a portion of the refractory metal is converted, then the resulting structure will comprise a bilayer of refractory metal and refractory metal nitride. If the entire layer of refractory metal is converted, then the resulting structure will not be a bilayer, and contain only the nitride. Note that in some embodiments, no bulk layer is deposited and the entire nucleation layer is converted to nitride. The nitride layer is a more effective (in comparison to elemental refractory metal) diffusion barrier and electromigration barrier.

After the nitride layer is formed (if necessary), the process continues with formation of the next higher metallization layer with copper lines and dielectric (assuming that the previous layer was not the last layer of the device). See 217. Each metallization layer may be processed as described above in the process flow of FIG. 2.

Figure 3:
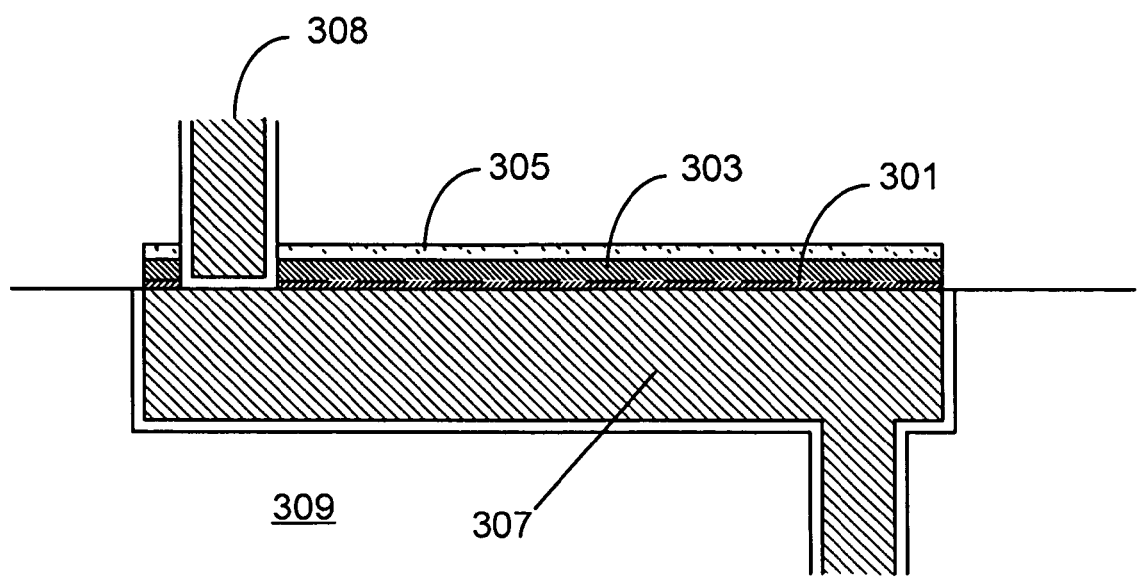
FIG. 3 is a schematic illustration of part of a damascene structure in a semiconductor device wherein the copper is capped with a refractory metal nucleation layer, a bulk refractory metal and refractory metal nitride.

FIG. 3 illustrates a cross section of a part of a damascene device after undergoing methods described in the present invention. As shown, a Cu line 307 is embedded in an insulator 309. A refractive metal nucleation layer 301 has been deposited over the Cu line, onto which a refractive metal bulk layer 303 has been selectively deposited. An upper portion of the refractive metal bulk layer has been nitrided to form a refractive metal nitride layer 305. In this example, the capping layer consists of the refractive metal nucleation layer (301), the refractive metal bulk layer (303) and the refractive metal nitride layer (305). The thickness of each of these layers depends on the application and the technology node. For many applications, the thickness of the refractive metal nucleation layer ranges between about 3 and 20 angstroms, the refractive metal bulk layer ranges between about 8 and 100 angstroms and the refractive metal nitride layer ranges between about 5 and 20 angstroms. After the capping layer is deposited, typically fluorine-doped silicon dioxide is deposited over the capping layer as part of the next metalization layer. Alternatively, a silicon nitride layer can be deposited over the capping layer to further enhance the barrier properties of the capping layer. Note that the via 308 to the overlying metal layer may contact the copper conductor directly as shown, or alternatively, may contact the refractory or refractory nitride if the dielectric etch used for via formation is selective to the refractory nitride or refractory metal.

Refractory Metal Nucleation Layer Formation

To provide for an effective capping layer for reducing copper electromigration, it is preferable that the refractory metal layer be deposited as a nucleation layer. A nucleation layer is a thin, conformal layer that has low contact resistance and adheres well to the underlying surface on which it is deposited. The morphology of the nucleation layer is often different from that of the bulk layer. For example, the nucleation layer generally has a relatively smaller grain size.

Refractory metals, such as tungsten, tantalum, molybdenum, titanium, ruthenium or cobalt are preferred materials for the nucleation layer. Generally, refractory metals have high melting points and bond strongly to copper. An especially preferred refractory metal for use with this invention is tungsten.

As indicated previously, the refractory metal nucleation layer can be formed by various processes. Referring back to FIG. 2, two preferred processes are shown in process steps 207 and 209–211. The first is an atomic layer deposition (ALD) or chemical vapor deposition (CVD) technique 207. The second process is a two stage process that involves first forming a copper silicide layer on the exposed copper line surface (209)—by reaction with silane for example—and second exposing the copper silicide to a gas containing the desired refractory metal (211).

The first method described—depositing the refractory metal directly using ALD or CVD—involves exposing the copper surface to gaseous metal precursor and reducing agent (FIG. 2, block 207). ALD methods differ from CVD methods in that they are based on separate surface-controlled reactions. In ALD, the metal precursors and reducing agents are directed alternately over a substrate surface, separated by purging steps using an inert gas or other method. ALD relies on the chemisorption of a gaseous precursor to form a "saturated layer" of the metal precursor on a substrate surface. This allows for a more conformal, thin and controlled deposition compared to that formed by traditional CVD methods.

In one embodiment of the present invention, ALD is used to form a tungsten nucleation layer. Preferred metal precursors for tungsten are one of $WF_6$, $WCl_6$ and $W(CO)_6$. Corresponding precursors for molybdenum, tantalum, titanium, and other suitable refractory metals are known to those of skill in the art. Preferred reducing agents include the following: $H_2$ $Si_2H_4$, $Si_2H_6$ and $B_2H_6$. Generally, the deposition conditions depend upon the nature of the precursors/reactants, the flow rates and length of exposure to the precursor/reactants and the desired thickness of the deposition film. Under typical conditions, the more preferable flow rates of the tungsten precursor are between about 10 and 20 sccm (over between about 1 and 5 seconds). Suitable pressure ranges for the tungsten precursors are between about 0.1 and 10 Torr, more preferably between about 0.5 and 1 Torr. Suitable substrate temperature ranges are between about 150 and 400 degrees Celsius, more preferably between about 250 and 350 degrees Celsius. Likewise, the hydride reducing agent exposure should be such that the hydride reacts sufficiently with the saturated layer of tungsten precursor to leave tungsten metal on the substrate surface. Under typical conditions, the more preferable flow rates times for the hydride reducing agent are between about 10 and 100 sccm (over between about 1 and 5 seconds). Suitable pressure ranges for the reducing agent are between about 0.1 and 10 Torr, more preferably between about 0.5 and 1.0 Torr. Suitable substrate temperature ranges are between about 150 and 400 degrees Celsius, more preferably between about 250 and 350 degrees Celsius. Temperatures and pressures for the metal precursor and hydride are generally similar.

Note that ALD processes form very thin layers of refractory metal (on the order of single atom thickness) during each cycle. Therefore, depending upon application, it is desirable to repeat the cycles of precursor exposure and reducing agent exposure two or more times. The exact number of cycles depends upon the desired thickness of the complete layer.

In one embodiment of the present invention, CVD is used to form a tungsten nucleation layer. For CVD of tungsten, exposure to the gaseous reactants is not dependent upon the formation of a saturated layer to form on the substrate surface and is therefore performed in one pass. That is, CVD does not involve separate reaction cycles. The metal precursors and the reducing agents are introduced to the surface substrate at the same time. Like ALD, preferred metal precursors for tungsten are one of $WF_6$, $WCl_6$ and $W(CO)_6$ and preferred reducing agents are one of $H_2$ $Si_2H_4$, $Si_2H_6$ and $B_2H_6$. Suitable pressures range from about 1 and 10 Torr, more preferably between about 1 and 5 Torr. The flow rates to the reactants depend on the desired thickness and composition of film deposition. Under typical conditions, the more preferable flow rates are between about 20 and 100 sccm. Suitable substrate temperatures range from about 300 and 450 degrees Celsius, more preferably between about 350 and 400 degrees Celsius.

The second method described for forming the refractory metal nucleation layer is a two-step process (FIG. 2, blocks 209–211). The first step in this process is forming a Cu silicide layer. The second step is exposing this Cu silicide layer to a reactive metal precursor to create the metal nucleation layer. In other words, the formation of Cu silicide is followed by the formation of a tungsten nucleation layer. This is accomplished by exposing the Cu surface to a silane, preferably $SiH_4$. Under typical conditions, the more preferable flow rates of silane are between about 100 and 200 sccm. Suitable pressures range between about 1 and 10 Torr, more preferably between about 1 and 5 Torr. Suitable substrate temperatures for the silicide reaction range between about 250 and 400 degrees Celsius, more preferably between about 300 and 350 degrees Celsius. After a Cu silicide layer of sufficient coverage and thickness is achieved, the Cu silicide is then exposed to a reactive tungsten precursor (or other refractory metal precursor) capable of forming a volatile silicon byproduct. The reactive tungsten precursor reacts with Cu silicide to convert the silicide into Cu metal and a volatile silicon compound such as $SiF_4$, with a tungsten nucleation layer resulting. Preferred metal precursors for tungsten are one of $WCl_6$ and $W(CO)_6$ and substituted-tungsten carbonyls, more preferably $WF_6$. Under typical conditions, the more preferable flow rates for the reactant metal precursor are between about 20 and 100 sccm. Suitable pressures range between about 1 and 40 Torr, more preferably between about 1 and 10 Torr. Suitable temperatures range between about 300 and 450 degrees Celsius, more preferably between about 300 and 350 degrees Celsius.

After the refractive metal nucleation layer is formed, if the metal layer is not yet of desired thickness, subsequent bulk deposition of refractory metal may follow. Bulk deposition by ALD or CVD can be implemented to form a refractory metal of desired thickness. Referring back to the process flow in FIG. 2, this is accomplished at block 213. Typically, the bulk deposition process employs the same or similar precursor to that employed in the nucleation layer deposition. However, bulk deposition favors use of a different reducing agent, preferably hydrogen or a mixture that is relatively rich in hydrogen, or an increase in pressure.

Refractory Metal Nitride Formation

As indicated previously, although a refractory metal cap can be effective for preventing electromigration at the silicon nitride interface, in some cases it is still possible for Cu to diffuse or migrate through the refractive metal barrier. To improve the barrier qualities of the refractory metal cap, it may be necessary to convert part of the cap into a refractory metal nitride layer. Referring back to the process flow in FIG. 2, nitridation is shown at block 215.

Various suitable nitridation techniques are available to those skilled in the art. Many of these techniques involve contacting the substrate with a plasma containing nitride species. In one embodiment, the refractory metal nitride layer is formed by placing the semiconductor substrate on a RF electrode and exposing the refractory metal surface to a nitrogen containing plasma. Suitable nitrogen containing gases comprises at least one of $N_2$, $NH_3$, and $N_2H_4$ or a mixture of gases that contain a nitrogen containing gas along with other inert gases such as argon or helium. Nitrogen atoms and ions are generated in the plasma and react with the refractive metal surface to form the nitride. The bias placed on substrate electrode affects the directional momentum of the ionic species striking the substrate. In a typical case, the bias of the RF electrode ranges between about 10 and 500 watts, more preferably between about 50 and 100 watts. Suitable reactor pressures for nitridation range between about 0.05 and 10 Torr, more preferably between about 0.5 and 1 Torr. Substrate temperatures may range between about 300 and 450 degrees Celsius, more preferably between about 300 and 350 degrees Celsius.

Other embodiments of the invention employ reactors having an RF electrode located away from the substrate. Such reactors may also include an electrode located beneath the substrate. In one example, the reactor includes an external RF electrode that is capacitively or inductively coupled, such as a High Density Plasma (HDP) system can be used. Generally, a high-density plasma is any plasma having electron density of at least about $1 \times 10^{11}$ electrons per cubic centimeter. Typically, though not necessarily, high-density plasma reactors operate at relatively low pressures, in the range of 100 mTorr or lower. In a typical example, the electrode frequency used in such HDP systems is about 300 kHz, although other frequencies can be used. In some embodiments, the reactor employs a down-stream plasma.

Figure 4:
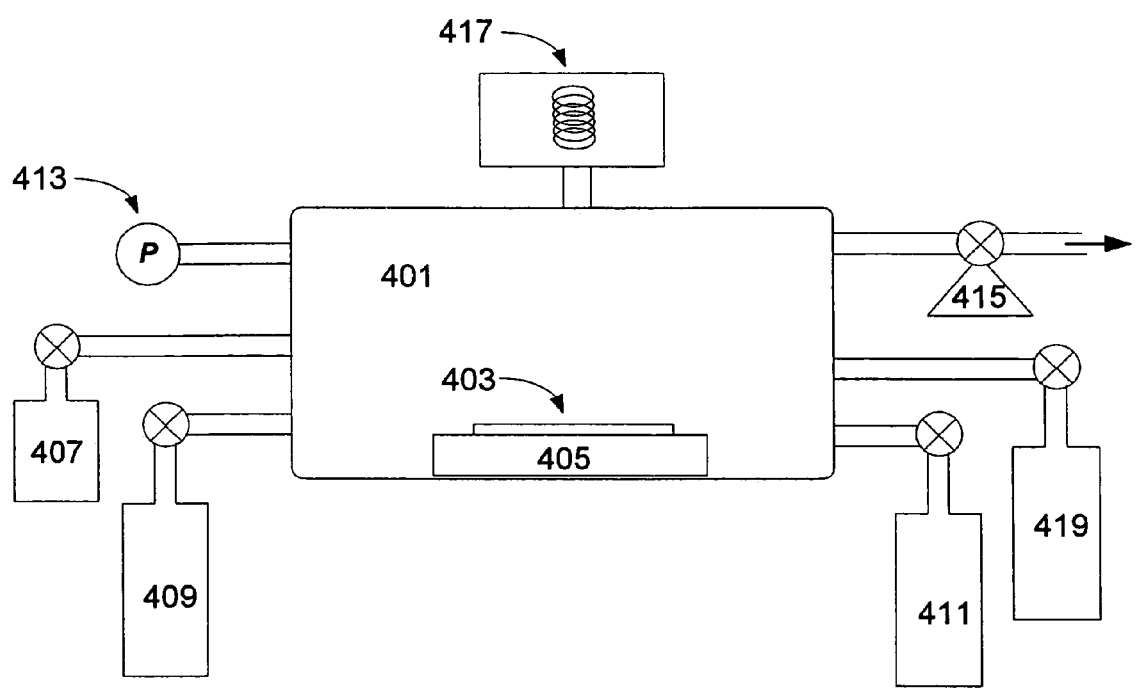
FIG. 4 is a schematic diagram showing the basic features of an apparatus suitable for practicing the current invention.

FIG. 4 is a schematic of a typical apparatus in which the processes in the present invention take place. The semiconductor wafer 403 is placed on top of a supporting pedestal 405 in a reaction chamber 401. The supporting pedestal 405 has a thermocouple or other temperature-sensing device attached to monitor the temperature of the wafer. The temperature of the wafer can be heated by any number commonly known methods, such as a resistive heating element. A pressure gauge 413 monitors the pressure inside the chamber during operation. The metal halide 407 and reducing agent hydride 409 are introduced in a controlled manner using valves. A neutral gas source 411, such as argon gas, allows for more chamber pressure and reactant concentration control. A plasma generator source 417 allows for the introduction of hydrogen plasma for removing halogens after reaction described previously. Nitrogen containing gas 419, such as $NH_3$, can be introduced for an optional nitridation step described previously. A pump with valve 415 is used to evacuate the chamber of reactant by products and unused reactants between cycles of sample exposure to reactant gases.

Although various details of the apparatus have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A semiconductor device comprising:
   (a) copper metal conductive lines inlaid in a dielectric support;
   (b) a refractory metal layer selectively formed on the copper metal conductive lines; and
   (c) a refractory metal nitride layer formed on a surface of the refractory metal layer opposite the copper metal lines, wherein the refractory metal nitride is effective for blocking copper electromigration and in the conductive lines and for blocking diffusion of copper from the copper conductive lines; wherein the refractory metal layer in (b) comprises a nucleation layer and a bulk layer, and further wherein the nucleation layer comprises a refractory metal selected from tungsten, tantalum, molybdenum, titanium, ruthenium or cobalt.

2. The semiconductor device of claim 1, wherein the refractory metal layer in (b) is between about 3 and 100 angstroms thick.

3. The semiconductor device of claim 1, wherein the refractory metal nitride layer in (c) is between about 3 and 30 angstroms thick.

4. The semiconductor device of claim 1, wherein the refractory metal layer in (b) is tungsten.

5. The semiconductor device of claim 1, wherein the bulk layer is tungsten.

6. The semiconductor device of claim 1, wherein the bulk layer comprises at least one of tungsten, tantalum, titanium, molybdenum, ruthenium or cobalt.

7. The semiconductor device of claim 1, wherein the bulk layer is between about 3 and 100 angstroms thick.

8. The semiconductor device of claim 1, wherein the nucleation layer is between about 3 and 30 angstroms thick.

9. The semiconductor device of claim 1, wherein the refractory metal resides selectively on the copper and not on other co-planar regions of the device.

10. The semiconductor device of claim 1, further comprising:
    (d) a fluorine-doped silicon dioxide layer formed on at least the refractory metal nitride layer.

11. The semiconductor device of claim 1, further comprising:
    (d) a silicon nitride layer formed on at least the refractory metal nitride layer.

12. The semiconductor device of claim 1, wherein the semiconductor device is a damascene device.

13. The semiconductor device of claim 4, wherein the refractory metal nitride layer in (c) is tungsten nitride.

* * * * *

UNITED STATES PATENT AND TRADEMARK OFFICE
CERTIFICATE OF CORRECTION

PATENT NO. : 7,157,798 B1  
APPLICATION NO. : 10/984126  
DATED : January 2, 2007  
INVENTOR(S) : Fair et al.

Page 1 of 1

It is certified that error appears in the above-identified patent and that said Letters Patent is hereby corrected as shown below:

In the Title Page:

In the "(75) Inventors" section, change "Nerissa Taylor" to --Nerissa Draeger--.

Signed and Sealed this

Twentieth Day of November, 2007

JON W. DUDAS  
*Director of the United States Patent and Trademark Office*